(12) United States Patent
Liobe et al.

(10) Patent No.: US 10,491,231 B2
(45) Date of Patent: Nov. 26, 2019

(54) RECONFIGURABLE ADC ARCHITECTURE FOR IMAGING-BASED APPLICATIONS

(71) Applicant: Sensors Unlimited, Inc., Princeton, NJ (US)

(72) Inventors: John Liobe, New York, NY (US); Joshua Lund, Dallas, TX (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 15/932,293

(22) Filed: Feb. 16, 2018

(65) Prior Publication Data
US 2019/0260384 A1   Aug. 22, 2019

(51) Int. Cl.
| H03M 1/46 | (2006.01) |
| H03M 1/12 | (2006.01) |
| H03M 1/56 | (2006.01) |
| H04N 5/378 | (2011.01) |
| H03M 3/00 | (2006.01) |

(52) U.S. Cl.
CPC ......... *H03M 1/462* (2013.01); *H03M 1/1205* (2013.01); *H03M 1/56* (2013.01); *H03M 3/48* (2013.01); *H04N 5/378* (2013.01)

(58) Field of Classification Search
CPC ...... H03M 1/56; H03M 1/462; H03M 1/1205; H03M 3/48
USPC ......................................................... 341/143
See application file for complete search history.

(56) References Cited

U.S. PATENT DOCUMENTS

| 7,135,680 | B2 | 11/2006 | Elkind et al. | |
| 8,040,271 | B2* | 10/2011 | Furuta ................. | H03M 1/0682 341/163 |
| 8,164,504 | B2* | 4/2012 | Cho ..................... | H03M 1/0678 341/118 |
| 8,368,571 | B2* | 2/2013 | Siragusa ............. | H03M 1/1009 341/118 |
| 8,451,151 | B2* | 5/2013 | Lin ..................... | H03M 1/1061 341/110 |

(Continued)

OTHER PUBLICATIONS

Josep Maria Margarit Taule, "Low-power CMOS digital-pixel imagers for high-speed uncooled PBSE IR applications," A dissertation submitted for the degree of Doctor of Philosophy by the Universitat Politecnica de Catalunya, under the PhD program in Electronic Engineering, Nov. 2015.

(Continued)

*Primary Examiner* — Lam T Mai
(74) *Attorney, Agent, or Firm* — Locke Lord LLP; Scott D. Wofsy; Judy R. Naamat

(57) ABSTRACT

A configurable analog to digital converter (ADC) is provided. The configurable ADC includes a comparator receiving and comparing a first analog voltage signal to a second analog voltage signal V-DAC and outputting a signal C-OUT that is responsive to a result of the comparison, an integrator operating on C-OUT and outputting an N-bit value, a digital-to analog converter (DAC) converting the N-bit value to the second analog voltage signal V-DAC, and an integrator, the integrator including the N-bit memory, which is coupled to an arithmetic logic unit (ALU), the N-bit memory and ALU cooperating to perform operations using both the N-bit value and C-OUT. The configurable ADC is configured to operate in more than one mode selected from a plurality of selectable ADC modes.

24 Claims, 6 Drawing Sheets

(56) References Cited

U.S. PATENT DOCUMENTS

| | | |
|---|---|---|
| 8,492,697 B2 | 7/2013 | Neubauer et al. |
| 8,898,491 B2 * | 11/2014 | Huynh ................ G06F 17/5063 |
| | | 370/212 |
| 8,947,275 B2 * | 2/2015 | Sim ..................... H03M 1/1061 |
| | | 341/118 |
| 9,106,246 B2 * | 8/2015 | Yang ..................... H03M 1/403 |
| 9,531,400 B1 * | 12/2016 | Wen ...................... H03M 1/403 |
| 9,774,347 B2 | 9/2017 | Chae et al. |
| 10,020,816 B1 * | 7/2018 | Cleris ..................... H03M 1/38 |
| 10,084,469 B1 * | 9/2018 | Pflum .................... H03M 1/38 |
| 10,151,845 B1 * | 12/2018 | Viswanath ............. G01T 1/247 |
| 2017/0352694 A1 * | 12/2017 | Panicacci .......... H01L 27/14609 |
| 2017/0352696 A1 | 12/2017 | Panicacci |

OTHER PUBLICATIONS

Tai-Ping Sun, et al., "A buffer direct injection and direct injection readout circuit with mode selection design for infrared focal plane arrays," Infrared Physics & Technology 63 (2014) 140-146, Journal homepage: www.elsevier.com/locate/infrared.

* cited by examiner

RECONFIGURABLE ADC ARCHITECTURE FOR IMAGING-BASED APPLICATIONS

BACKGROUND OF THE DISCLOSURE

1. Field of the Invention

The present disclosure relates to analog-to-digital conversion (ADC) for imaging-based applications, and in particular to reconfigurable ADC architectures for imaging based applications.

2. Description of Related Art

In an imaging device, input radiation is transduced into electrons, which subsequently are converted to an analog voltage. This analog voltage is then digitized by an analog-to-digital converter (ADC) in order to undergo further processing. There are different types of ADC architectures that can be implemented in an imaging device for digitizing the analog imaging voltage. Three types of ADCs include single-slope (SS), successive approximation register (SAR), and sigma-delta modulator-based ADCs. The SS ADC is the most commonly-used architecture because it offers moderate bit resolution while having a relatively small size, weight, and level of power consumption (SWaP) while meeting the requisite speeds of many imaging applications. Increasingly more applications require higher operating speeds and a dynamic range that is beyond the capabilities of the architecture of a single-slope ADC. In some technologies, SAR and/or sigma-delta modulation-based ADCs are deployed in order to realize objectives of higher performance applications, and these ADCs have a higher SWaP footprint than a single-slope ADC.

While conventional methods and systems have generally been considered satisfactory for their intended purpose, there is still a need in the art for ADC architectures that can support different imaging performance requirements with the smallest SWaP footprint. The present disclosure provides a solution for this.

SUMMARY OF THE INVENTION

In accordance with an aspect of the disclosure, a configurable analog to digital converter (ADC) is provided. The configurable ADC includes a comparator receiving and comparing a first analog voltage signal to a second analog voltage signal V-DAC and outputting a signal C-OUT that is responsive to a result of the comparison, an integrator operating on C-OUT and outputting an N-bit value, a digital-to analog converter (DAC) converting the N-bit value to the second analog voltage signal V-DAC, and an integrator, the integrator including the N-bit memory, which is coupled to an arithmetic logic unit (ALU), the N-bit memory and ALU cooperating to perform operations using both the N-bit value and C-OUT. The configurable ADC is configured to operate in more than one mode selected from a plurality of selectable ADC modes.

In accordance with another aspect of the disclosure, the configurable ADC is included in a readout circuit of an imaging device.

In still a further aspect of the disclosure, a method of is provided. The method includes receiving and comparing an analog voltage signal and a voltage V-DAC from a digital-to analog converter (DAC) and outputting a signal C-OUT that is responsive to a result of the comparison, receiving an N-bit value stored in an N-bit memory, and cooperatively performing logic operations using both the N-bit value and the C-OUT signal output from the comparator. The DAC and management of C-OUT are configurable to cause the configurable ADC to operate in any mode selected from modes including a single-slope mode, a successive approximation register (SAR) mode, and a sigma-delta modulation mode.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
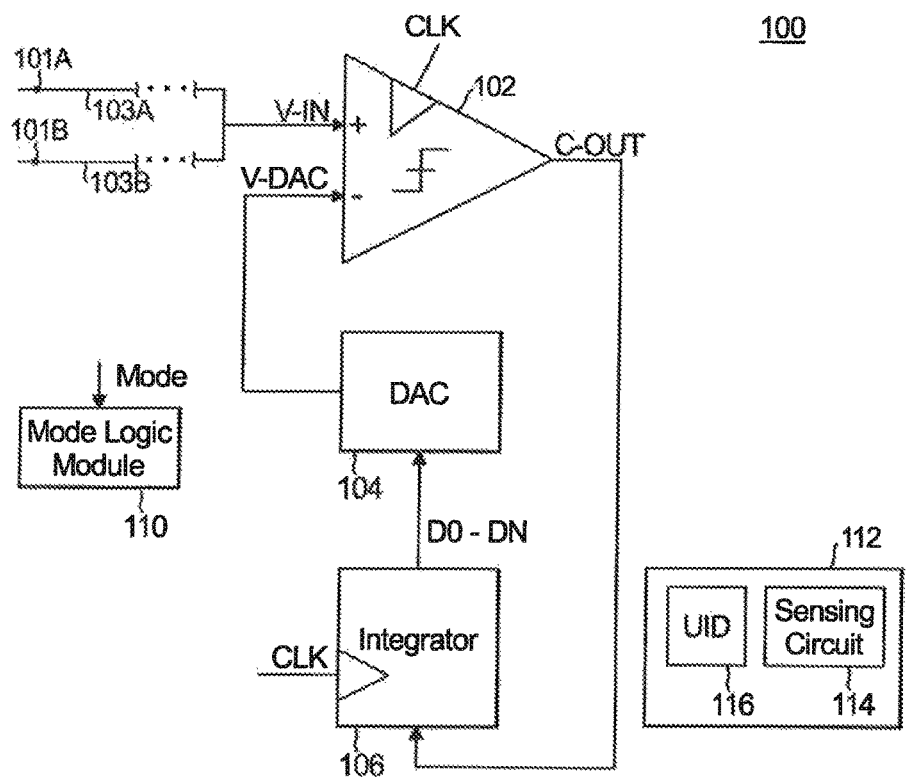
FIG. 1 shows a schematic diagram of an exemplary embodiment of an example configurable analog-digital-converter (ADC) that is capable of operating in different selected modes selectable from a single-slope (SS), successive approximation register (SAR) mode, or a sigma-delta modulation mode, in accordance with embodiments of the present disclosure.

Reference will now be made to the drawings wherein like reference numerals identify similar structural features or aspects of the subject disclosure. For purposes of explanation and illustration, and not limitation, a schematic diagram of an exemplary embodiment of a configurable analog-digital converter (ADC) for converting analog signals into digital signals in accordance with the disclosure is shown in FIG. 1 and is designated generally by reference character 100. Other embodiments of a configurable ADC in accordance with the disclosure, or aspects thereof, are provided in FIGS. 2-8, as will be described.

An imager can include a plurality of configurable ADCs 100, wherein each configurable ADC 100 operates on a signal output by one or more pixels of a pixel array of the imager. Different configurable ADCs 100 of the imager can be configured to operate in different ADC modes. For example, each configurable ADC 100 can be configured to operate in a selected mode, where in the mode is selected based on illumination levels to which the pixel(s) associated with that configurable ADC 100 are exposed. Additionally, the mode of operation of any of the configurable ADCs 100 can change during a single exposure.

The configurable ADC 100 is configured with a single ADC architecture that includes a comparator 102, a digital-to-analog converter (DAC) 104, and an integrator 106, which can be operated in a selected mode of a plurality of ADC modes, such as, without limitation to the specific modes listed, single-slope (SS) ADC mode, successive approximation register (SAR) ADC mode, or sigma-delta modulation ADC mode. A user can configure the configurable ADC 100 to operate in an SS mode, SAR mode, or sigma-delta modulation mode.

Accordingly, the configurable ADC 100 can be manufactured with a single architecture, for example as an integrated circuit or an application specific integrated circuit (ASIC). In each of the modes, the comparator 102 receives an input analog voltage signal V-IN at a first terminal (shown as a positive terminal). The input analog signal V-IN can be provided from a first signal path 103A that is coupled to an integration node 101A (or a buffered version of the pixel integration node) that is enabled throughout the integration period of a selected pixel of one or more pixels associated with the configurable ADC 100. Alternatively, the input analog signal V-IN can be provided from a second signal path 103B that is coupled to an integrated signal node 101B of a selected pixel of one or more pixels associated with the configurable ADC 100. An integrated signal is provided via the integrated signal node 101B, wherein the integrated signal is the final, integrated value provided by the pixel(s).

An output voltage from the DAC 104 is input at a second terminal (shown as a negative terminal) of the comparator 102. In the example shown, the comparator outputs a C-OUT signal having a LOW value when V-DAC<V-IN, wherein C-OUT transitions to a HIGH value when V-DAC ≥ V-IN. C-OUT can be determined at clocked intervals, and hold its value throughout each interval. According to design choice, the first terminal can be a negative terminal and the second terminal can be a positive terminal, and the C-OUT signal can be output having a HIGH value when V-DAC<V-IN, and transition to a LOW value when V-DAC≥V-IN. The disclosure is not restricted to a particular design choice or the example shown.

The comparator 102 can be implemented using an operational amplifier or in a simpler deployment a differential pair. In either implementation the analog input voltage is compared against a threshold voltage. The difference between these inputs is amplified, indicating whether the analog input voltage is greater than or less than the threshold voltage.

The DAC 104 receives a series of digits D0-DN from the integrator 106, converts the digital number D0-DN into an analog voltage, V-DAC, which is provided to the second input terminal of the comparator 102. The integrator receives the C-OUT signal that was output by the comparator 102. A clock signal CLK that defines the clocked intervals can be input to the comparator 102 and the integrator 106.

The configurable ADC 100 further includes a mode logic module 110 that receives a mode signal that is used to select a mode of operation from a plurality of ADC modes of operation, such as, but without limitation to, the SS mode, SAR mode and sigma-delta modulation mode.

The mode signal can be generated by a device external to the configurable ADC 100, such as an analog or digital processing device 112, for example in response to a condition sensed by a sensing circuit 114 or input from a user entered via a user input device (UID) 116.

Figure 1A:
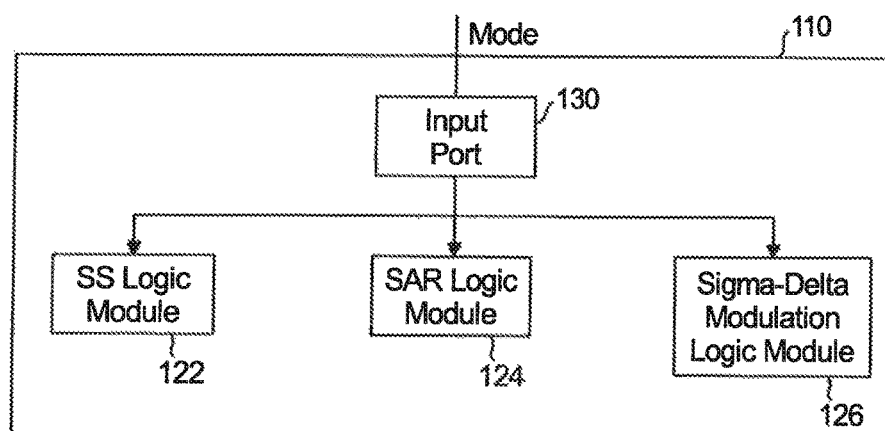
FIG. 1A shows a block diagram of an example mode logic module of the configurable ADC, in accordance with embodiments of the present disclosure.

FIG. 1A shows the mode logic module 110 in greater detail. The mode logic module 110 can include a logic module that corresponds to each mode of the different ADC modes supported. In the current example, the mode logic module 110 includes an SS logic module 122, an SAR logic module 124, and a sigma-delta modulator logic module 126. Other logic modules can be provided to support operation in other ADC modes. The mode logic module 110 can receive a mode signal via an input port 130. The mode signal can be processed by a mode selection circuit (not shown) that selects one of the logic modules 122, 124, 126, or the mode signal can be provided directly to the logic modules 122, 124, 126 so that one of the modes is selected based on the mode signal. Selection of one of the logic modules 122, 124, 126 causes the configurable ADC 100 to operate in the corresponding mode.

Each of the logic modules 122, 124, 126 can include one or more logic circuits that can include components such as logic gates, transmission gates, and switches, without limitation. The components, logic circuits, or logic modules 122, 124, 126 can use and/or output control signals. The logic modules 122, 124, 126 can optionally share one or more components. Additionally, the components of the logic modules 122, 124, 126 can be distributed to integrate with different components of the configurable ADC 100. For example, the logic modules 122, 124, 126 can control the input that is provided to the comparator 102 as V-IN and operation of components of the integrator 106 (e.g., the N-Bit memory 302 and the ALU 304 shown in FIG. 3).

Figure 2:
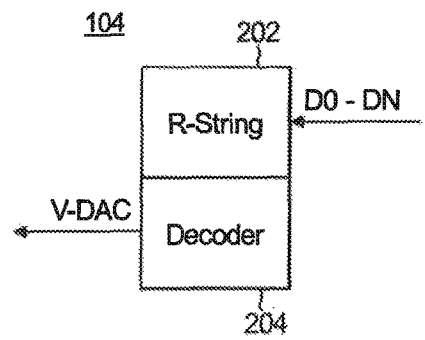
FIG. 2 shows a schematic diagram of an example digital-to-analog converter (DAC) of the configurable ADC shown in FIG. 1.

With reference to FIG. 2, the DAC 104 includes a resistor string (R-string) 202 and a decoder 204. The R-string 202 includes a series of resistors (not shown) coupled between ground and a reference voltage (not shown), with nodes (not shown) disposed in between the resistors. The nodes are coupled to respective comparators (not shown) of a series of comparators at a first corresponding terminal of a series of comparators. The respective comparators include second terminals that receive a signal that is compared to the signal received at the corresponding first terminal. The output of the series of comparators is decoded by the decoder 204 as V-DAC, which is provided to the second terminal of the comparator 102. The decoder 204 can be implemented using NOR- or NAND-based logic gates and transmission gates or switches implemented as single MOS transistors (PMOS or NMOS depending on the voltages being passed from the R-string).

Figure 3:
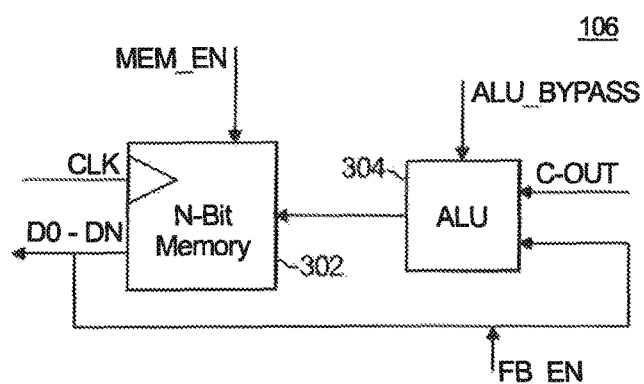
FIG. 3 shows a schematic diagram of an example integrator of the configurable ADC shown in FIG. 1.

With reference to FIG. 3, the integrator 106 is shown to include an N-bit memory 302 and an ALU 304 that receives C-OUT from the comparator 102. The N-bit memory 302 receives the output from the ALU 304 in all three implementations. When operating in the SS mode, the N-bit memory 302 counts CLK pulses; when C-OUT from the comparator 102 triggers, the current count value in the N-bit memory 302 is effectively saved, such as by being latched by the N-bit memory 302 or readout, e.g., to a column readout circuit. When operating in the sigma-delta modulation mode, the N-bit memory 302 aggregates, meaning sums, the C-OUT pulse (i.e., "0" or "1") from the comparator 102 with the current N-bit memory 302 value at every CLK. When operating in the SAR mode, the N-bit memory 302 serves as a typical memory device, with the ALU 304 controlling reading and writing to the N-bit memory as defined below.

The N-bit memory 302 can be implemented using any type of memory device (DRAM, SRAM, registers, or the like). As silicon area is typically highly coveted, DRAM or some 1T (one transistor) technology can be utilized to conserve silicon real estate.

The ALU 304 can be implemented using transmission gates and logic gates to perform the methods, logic, and operations (also referred to as logic operations) described in the disclosure.

The logic modules 122, 124, 126 can control operation of the N-bit memory 302 and the ALU 304 such as for controlling whether the ALU 304 is bypassed or the feedback path 306 is used. The logic modules 122, 124, 126 can generate and/or use control signals, such as the ALU_BYPASS or FB_EN signals.

The ALU 304 can effectively be bypassed based on operation of a control signal ALU_BYPASS. The control signal ALU_BYPASS can control, for example, a switch that disables the ALU 304 or enables a bypass path. When the ALU 304 is not bypassed, it performs logic operations for entering digits into (also referred to as storing in or writing into) the N-bit memory 302, wherein the logic operations can include operating on C-OUT and D0-DN for storage in the N-bit memory 302. When the ALU 304 is bypassed, the C-OUT signal is provided to the N-bit memory without being processed by the ALU 304, which can be accomplished by physically bypassing the ALU 304, logically bypassing the ALU 304 so that the ALU 304 does not process C-OUT, or disabling the ALU 304. The N-bit memory 302 stores a series of N bits, each bit being a digit, including a most significant bit (MSB), which is the left-most bit, and a least significant bit (LSB), which is the right-most bit. The N-bit memory can be initialized to a value, such as all 0's in the present example (or all 1's, in accordance with design choice). The series of stored N bits is output as D0-DN at the start of each time interval, wherein the time interval is defined by the clock signal CLK.

Figure 4:
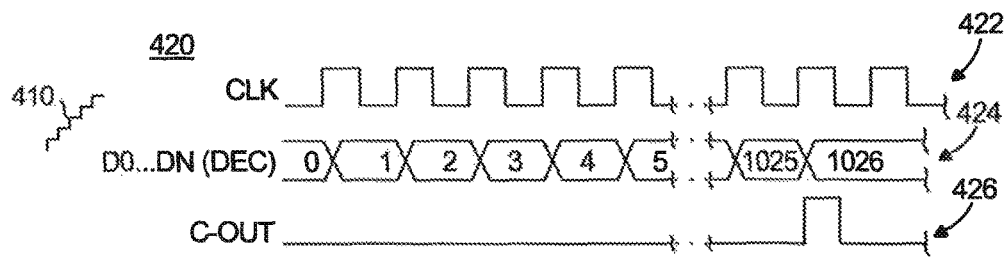
FIG. 4 is an example plot and timing diagram associated with the configurable ADC when it is configured to operate in the single-slope mode in accordance with embodiments of the present disclosure.

With reference to FIGS. 1-4, operation using the single-slope mode is described. The single-slope logic module 122 is selected to cause the configurable ADC 100 to operate in the single-slope mode. FIG. 4 shows an example of V-DAC signal 410 provided by the DAC 104 and an example timing diagram 420 input to the comparator 102 while the configurable ADC 100 operates in the single-slope mode. When operating in the single-slope mode, the V-IN signal is provided from signal path 103B for providing a final integrated signal to the comparator 102. The D0-DN output by the integrator 106 causes the DAC 104 to generate the V-DAC signal 410 as a ramp that is synchronous with the clock signal. The ramp is incremented every clock interval. Each clock interval, the comparator 102 compares the V-DAC signal 410 to the analog input signal V-IN. The N-bit value stored in the N-bit memory 302 is incremented with each CLK pulse, thus reflecting a count of the CLK pulses.

The ALU_BYPASS signal is enabled so that the ALU 304 is disabled or bypassed (physically or logically) and C-OUT is provided to the N-bit the memory 302 without being operated on by the ALU 304. Once the comparator causes C-OUT to go HIGH, the N-bit value stored in the N-bit memory 302 is exported from the N-bit memory 302, or the N-bit value stored in the N-bit memory 302 is no-longer updated. Exporting the value stored in the N-bit memory 302 can include outputting, also referred to as reading out, the value, e.g., to a column readout circuit (see FIG. 8). Preventing further updating of the value stored in the N-bit memory 302 can be performed, for example, by terminating the process of incrementing V-DAC (such as by operating a switch that enables an incrementing function performed by the DAC 104) or preventing further read access to the N-bit memory 302 (such as by operating a switch that enables access to the N-bit memory 302.

The timing diagram 420 shows an example clock signal plot 422, D0-DN plot 424, and C-OUT plot 426. As previously indicated, the integrator 106 counts the clock pulses shown in plot 422 and increments D0-DN based on the count. The D0-DN plot 424 shows D0-DN output by the integrator 106 incrementing until the comparator 102 is triggered to output a particular value each time a predefined result of a comparison of the V-DAC value and V-IN signal occurs. For example, the comparator 102 can be triggered to output a HIGH value each time the V-DAC first exceeds the input voltage V-IN. The comparator 102 can be configured to trigger HIGH or LOW based on a different condition, such as no longer exceeding, based on design choice. The disclosure is not limited to a particular design choice. In the example shown, V-DAC first exceeds the input voltage V-IN when the D0-DN bits have reached a digital count of 1026, which is a digital representation of the analog input value V-IN. When C-OUT is triggered to output C-OUT as a HIGH value, the ALU 304 is effectively bypassed and C-OUT is passed to the N-bit memory 302 to cause D0-DN to be effectively saved, such as by being latched in memory or readout, effectively disabling the counting of CLK pulses.

With reference to FIGS. 1-3 and 6, operation of the configurable ADC 100 using the SAR mode is described. The SAR logic module 124 is selected to cause the configurable ADC 100 to operate in the SAR mode. When operating in the SAR mode, the V-IN signal is provided from either signal path 103A or 103B for providing the integration node signal as it is actively integrating charge or a final integrated signal to the comparator 102, respectively, and the DAC 104 and integrator 106 use C-OUT to perform a binary search algorithm. The D0-DN output by the integrator 106 causes the DAC 104 to adjust the V-DAC in accordance with a binary search algorithm. Furthermore, when operating in the SAR mode, the V-IN signal input to the comparator 102 can be the final integrated value provided from node 101A or the integrating value coupled to the integrator node and provided from node 101B.

Figure 5:
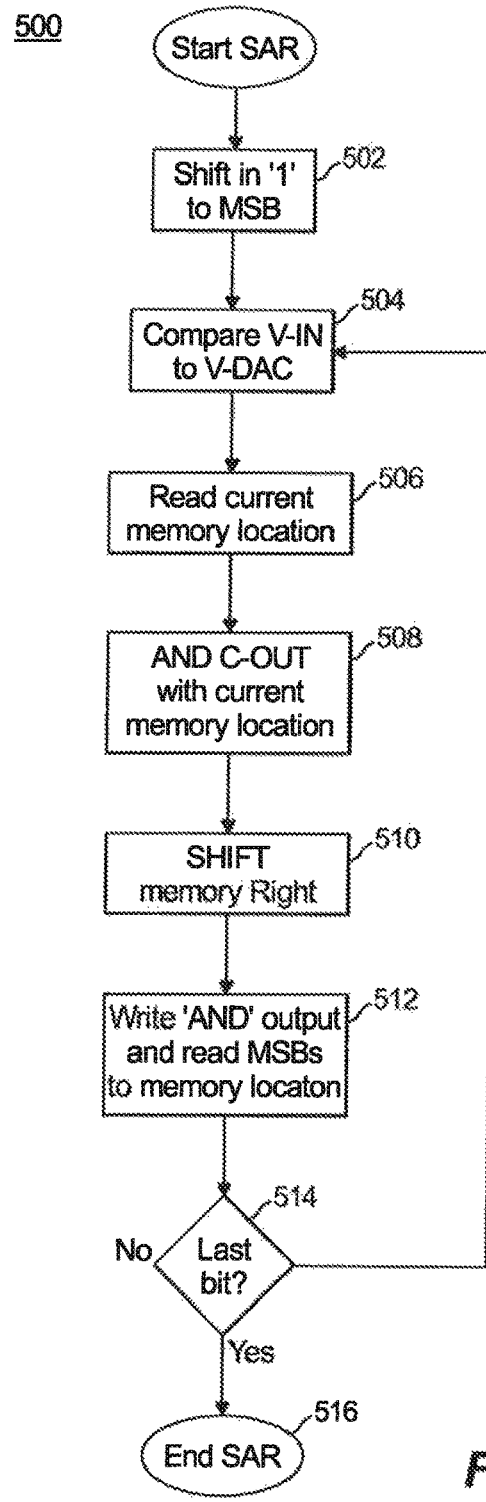
FIG. 5 is a flowchart showing example operations performed by the configurable ADC when it is configured to operate in the SAR mode in accordance with embodiments of the present disclosure.

With reference now to FIG. 5, shown is a flowchart demonstrating implementation of the various exemplary embodiments. It is noted that certain operations can be substituted or performed in separate circuits in order to perform a binary search algorithm. FIG. 5 shows a flowchart 500 of example operations performed by the integrator 106 in accordance with the SAR logic module that causes the ADC 100 to operate in the SAR mode. The integrator 106 performs the operations 502 and 506-516, whereas the comparator 102 performs operation 504. At operation 502 a '1' is shifted into the N-bit value stored in N-bit memory 302, shown in this example as D0-D3, to set the MSB D0. In the example shown, after the first shift D0-D3 is (0b1000).

At operation 504, comparator 102 receives V-DAC, which is the analog voltage converted from D0-D3, and compares V-DAC to V-IN and changes the value of C-OUT in response to a change in the relationship between V-DAC and V-IN as based on the comparison. In embodiments, the comparator 102 can perform the comparison once with each clock signal. In embodiments, the comparator 102 can perform the comparison more than once per clock signal. At operation 506, a read operation of the N-bit value stored in the N-bit memory 302 is performed (0b1000). Reading of the current N-bit value stored in the N-bit memory 302 can be performed, for example and without limitation by using a feedback path 306 (which can optionally be enabled by FB_EN) or by other ways of reading a current value from an N-bit memory 302. Of note is that when operating in the single-slope operation, the ALU 304 does not read the N-bit value stored by the N-bit memory and does not use the feedback path 306. At operation 508, a logical AND operation is performed to C-OUT and the N-bit value that was read.

At operation 510, the N-bit value stored in the N-bit memory 302 is shifted right (0b100). At operation 512, a result of the logical AND operation is written to the bit of interest of the stored N-bit value, which for the first iteration is the MSB. For example, if C-OUT='1' and the bit of interest is '1', then the result of the logical AND operation is '1' and a '1' is written to the bit of interest of the N-bit value (0b1100). However, if C-OUT were='0', then the result of the logical AND operation is '0' and a '0' is written to the bit of interest of the N-bit value (0b0100).

At operation 514 a determination is made whether the bit of interest is the last bit of the value D0-DN stored in the N-bit memory 302. If the determination at operation 514 is NO, then the method continues at operation 508 at the next clock interval. Accordingly, at the second clock interval, the operations 508-514 are performed for the MSB-1 value. Operations 508-514 are repeated for each bit of the value D0-DN stored in the N-bit memory 302, until the determination at operation 514 is YES, after which the execution of the SAR logic module ends at operation 516. Once the SAR logic module has completed its operations, the value D0-DN stored in the N-bit memory 302 is read out from the N-bit memory 302, such as to a column readout circuit.

Figure 6:
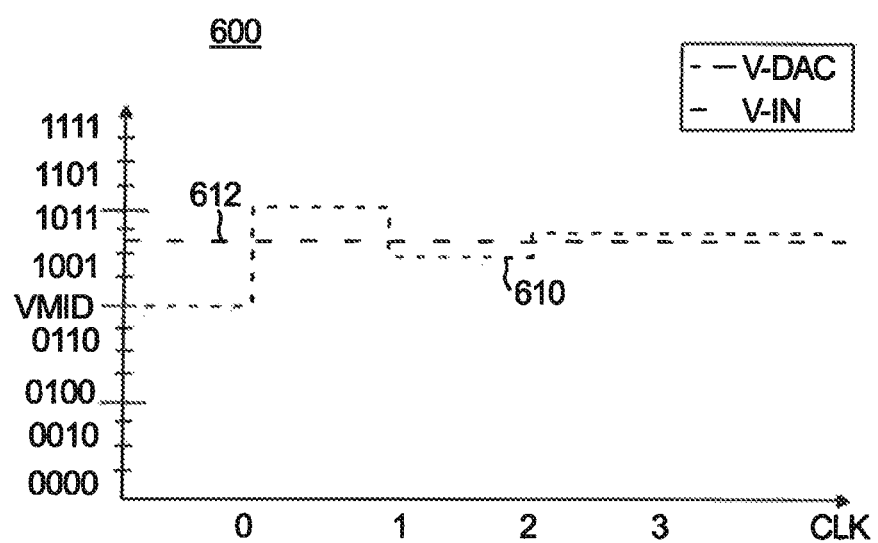
FIG. 6 is an example plot and timing diagram associated with the configurable ADC when it is configured to operate in the SAR mode in accordance with embodiments of the present disclosure.

FIG. 6 shows a plot 600 of example signals V-DAC 610 and V-IN 612 input to the comparator 102 as plotted versus the clock signal. The V-DAC signal 610 is shown at different values according to the binary search (such as by performing the operations shown in FIG. 5), beginning at a mid-point VMID and changing to a next value synchronous with the clock signal. At each clock interval, the comparator 102 compares the V-DAC signal 610 to the analog input signal V-IN 612.

With reference to FIGS. 1-3 and 7, operation of the configurable ADC 100 using the sigma-delta modulation mode is described. The sigma-delta modulation logic module 126 is selected to cause the configurable ADC 100 to operate in the sigma-delta modulation mode. FIG. 7A shows a plot 700 of example signals V-DAC 710 and V-IN 712 input to the comparator 102, plotted versus samples 714. At each sample, the comparator 102 compares the V-DAC signal 710 to the analog input signal V-IN 712. The arrows 714 and points 716 indicate whether the comparator 102 triggered or did not trigger, respectively.

Figure 7A:
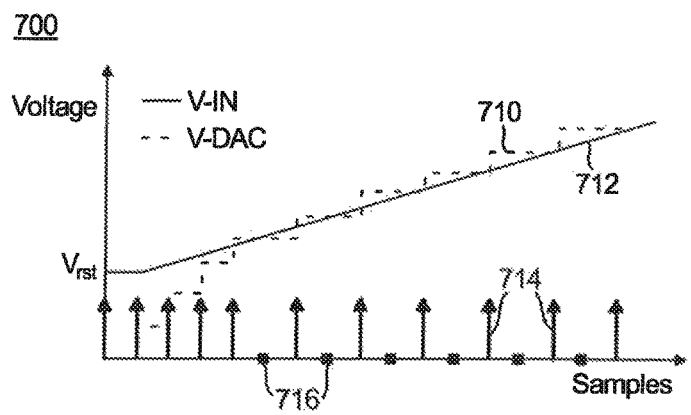
FIG. 7A is an example plot associated with the configurable ADC when it is configured to operate in the sigma-delta modulation mode in accordance with embodiments of the present disclosure.
Figure 7B:
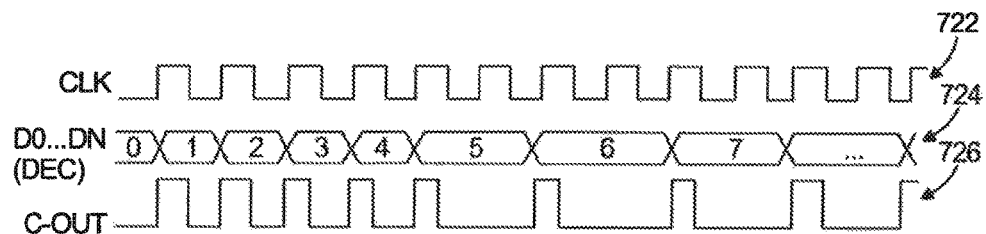
FIG. 7B is a timing diagram associated with the configurable ADC when it is configured to operate in the sigma-delta modulation mode in accordance with embodiments of the present disclosure.

FIG. 7B shows an example timing diagram 720 of showing operation of the configurable ADC 100 while in the sigma-delta modulation mode. Plot 720 shows the comparator 102 output C-OUT 724 triggering for every clock cycle 722 until the sixth clock sample (also referred to as clock pulse). At the sixth clock sample, the V-DAC signal 710 is above the V-IN signal 712 and the comparator 102 does not trigger as shown in plot 700. Correspondingly, the N-bit memory values (D0-DN) 726 do not increment, as shown in plot 720.

When operating in the sigma-delta modulation mode, the V-IN signal is provided from signal path 103A to the comparator 102 for providing a signal from the integration node (also refers to the buffered version of the pixel integration node) of a pixel coupled to the configurable ADS 100, wherein the integration node is enabled throughout the integration period. The configurable ADC 100 can be configured so that the N-bit memory 302 of integrator 106 is connected directly to an input terminal of the comparator 102, and is read out at the end of the integration interval. Alternatively the N-bit memory 302 may not be connected directly to the input terminal of the comparator 102 and may be read out during the entirety of the integration interval or at some intermediate interval between the start and end of integration interval.

The integration interval is the time in which input radiation is accumulated by readout electronics, most namely by a pixel associated with the readout electronics. The start of this interval is typically defined by a pixel reset signal. The end of the integration interval is typically defined by the reading of the accumulated charge within the pixel. For a case where the pixel is being read during the entirety of the integration cycle, one can read out an entire line (e.g., row) before moving onto a next line, or more preferably one can read out a line several times during an imaging frame. For example, if an integration interval requires 128 pixel clocks, one can read out each row every 16 clocks so that 8 readout frames of data are extracted.

In sigma-delta modulation mode the configurable ADC 100 tracks the slope of the signal provided from the integration node of the pixel coupled to the configurable ADC 100, rather than reporting the digitized accumulated pixel value at the end of integration. When operating in the sigma-delta modulation mode, The D0-DN output by the integrator 106 causes the DAC 104 to match the slope of integration of the associated pixel. This operation is realized by the D0-DN value of FIG. 3 delivered to the decoder 204 of DAC 104 of FIG. 2. In the sigma-delta modulation mode the value stored in the N-bit memory 302 at each clock cycle represents an amount the integrated value V-IN changed between clock cycles. For example, in a case where the input radiation on the associated pixel is small, it would take several clock cycles for enough charge to trigger the comparator 102, the triggering of the comparator resulting in a C-OUT pulse. On the contrary, when there is a large amount of input radiation incident on the associated pixel, the comparator 102 would be triggered every clock cycle. The final accumulated result in the N-bit memory at the end of the integration interval is equal to the number of C-OUT pulses.

The comparator 102 is triggered to output a particular value each time a predefined result of a comparison of the integration node value and V-DAC signal occurs. For example, the comparator 102 can be triggered to output a HIGH value each time the integration node value is exceeded by V-DAC. The comparator 102 can be configured to trigger HIGH or LOW based on a different condition, such as no longer exceeding, based on design choice. The disclosure is not limited to a particular design choice.

The integrator 106 accumulates the number of comparator triggers (or C-OUT pulses) in a given integration interval. The rate of accumulation is indicative of the slope of integration (dV/dt) at the integration node. The accumulated value is indicative of the total integrated voltage [integral (dV/dt)]. The accumulated value is stored in the N-bit memory 302. C-OUT is provided directly from the comparator 102 to the ALU 304, wherein it is accumulated with the current N-bit memory value.

Plot 700 shows an integration node voltage input to the comparator 102, starting at a reset voltage $V_{rst}$, increasing during the integration interval and the comparator 102 being triggered to output a HIGH value each time the integrated node voltage exceeds the V-DAC. Each time the comparator 102 is triggered, the V-DAC value is caused to be incremented (or decreased, based on design choice).

In the examples described, the value stored in the N-bit memory 302 is readout at the conclusion of an integration interval when operating in the SS or SAR modes. However, in other examples, the value stored in the N-bit memory 302 can be readout throughout the integration interval. In other words, the configurable ADC 100 can be configured so that the integrator 106 is connected directly to both the DAC 104 and a column readout bus. The integrator 106 outputs D0-DN can be readout at the end of respective integration intervals or throughout the integration intervals.

Accordingly, in accordance with the disclosure, in each of the SS, SAR and sigma-delta modulation modes, the N-bit memory 302 and the ALU 304 of the integrator 106 cooperate to perform operations using both the N-bit value stored in the N-bit memory 302 and the C-OUT signal output by the comparator 102.

Figure 8:
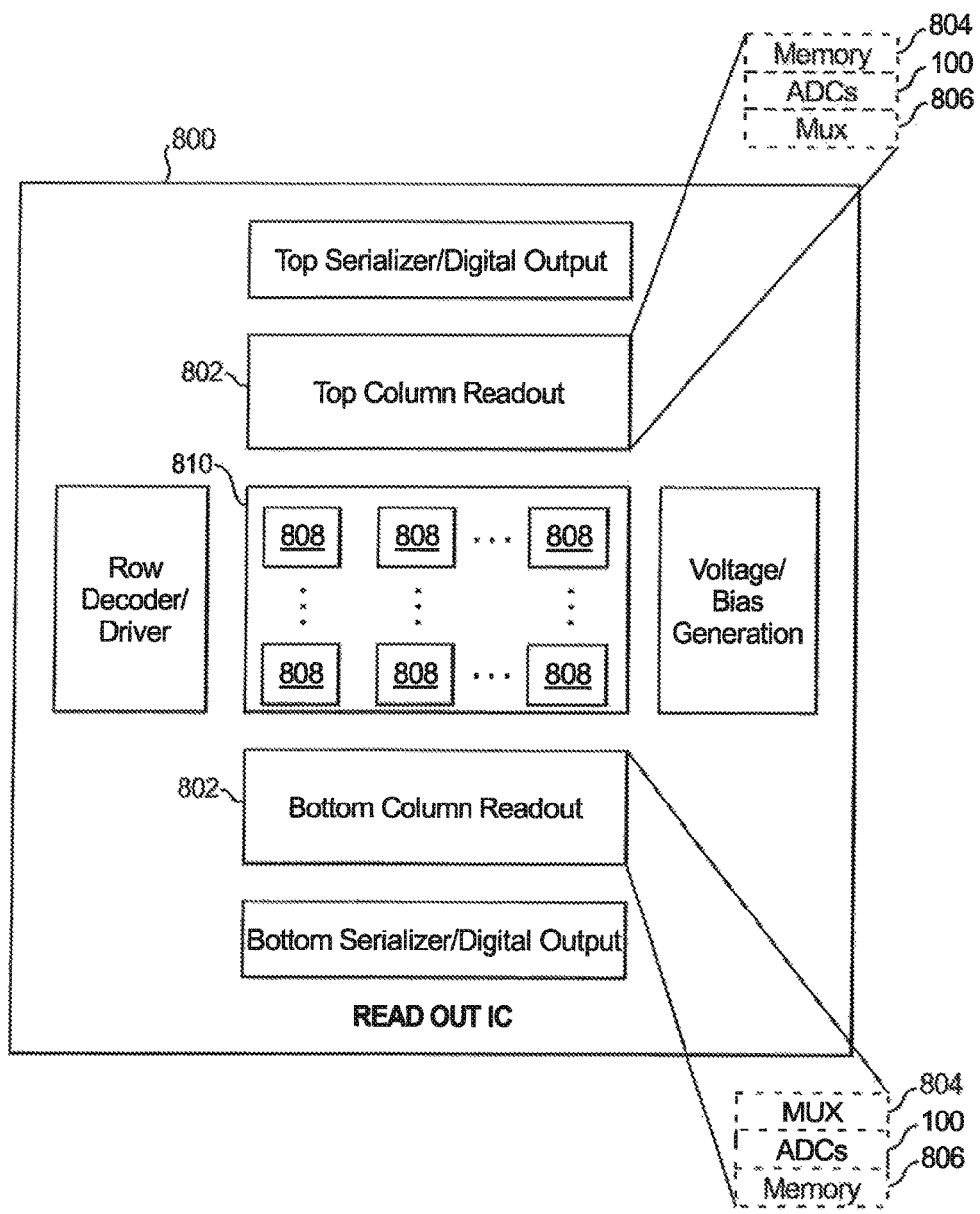
FIG. 8 is a schematic diagram of an example readout integrated circuit that includes the configurable ADC in accordance with embodiments of the present disclosure.

With reference to FIG. 8, a schematic diagram of an example readout IC (ROIC) 800, such as of an imaging device, is shown. The ROIC 800 includes column readout blocks 802 that include at least one memory 804, at least one multiplexor (MUX) 806, at least one reconfigurable ADC 100, and a pixel array 810 of pixels 808. The pixels 808 each include an integration node 101A and an integrated signal node 101B. Each ADC 100 is coupled to one or more pixels 810 and processes signals provided by the integration node 101A or the integrated signal node 101B of a selected pixel 810 of the pixels 810 to which it is coupled.

In embodiments, different modes can be selected for different configurable ADCs 100 of the ROIC 800. In embodiments, different sections of pixels 808 the pixel array 810 can be coupled to respective configurable ADCs 100 that operate in different modes. In embodiments, at least a first set of one or more of the configurable ADCs 100 coupled to the pixel array 810 is configured to operate in a first mode that is different than a second mode for which a second set of one or more configurable ADCs 100 coupled to the pixel array 810 that are different than the first set are configured to operate. For example the selection of the first and second modes can be based on sensed conditions, such as illumination, to which the first and second sets of one or more configurable ADCs are exposed.

In embodiments, the mode can be changes during operation of the imaging device, such as based on conditions sensed during operation. In embodiments, the mode can be changed during a single exposure for that exposure or for the beginning of a next exposure.

In embodiments, the mode of operation of one or more of the configurable ADCs 100 is selected based on a coarse digitized signal output by a flash ADC of one or more pixels 808 that corresponds to an the analog imaging signal output by a passive imaging circuit of the one or more pixels 808, and is indicative of a level of illumination to which that pixel is exposed. The coarse digitized signal output by the flash ADC is described in U.S. patent application Ser. No. 15/895,632 filed on Feb. 13, 2018.

In embodiments, the configurable ADCs 100 associated with the pixels 808 of the pixel array 810 can operate using different modes during a single exposure. In embodiments, when an integration node of a pixel 808 is monitored during an entirety of an exposure, and the integration node is coupled to the associated configurable ADC 100 to provide the input V-IN, digital correlated double sampling (CDS) can be performed to remove reset noise.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto the programmable data processing apparatus to cause a series of operational operations to be performed on the programmable apparatus to produce a computer implemented process such that the instructions which execute on the programmable apparatus provide processes for implementing the functions/acts specified in the flowchart and/or block diagram block or blocks.

The methods and systems of the present disclosure, as described above and shown in the drawings, provide for a configurable ADC that has a comparator, a DAC, and an integrator, and that these components can be configured to operate in different modes, including an SS mode, an SAR mode, and a sigma-delta modulation mode. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A configurable analog to digital converter (ADC))
   a comparator configured to receive and compare a first analog voltage signal to a second analog voltage signal V-DAC and outputting a signal C-OUT that is responsive to a result of the comparison;
   an integrator configured to operate on C-OUT and outputting an N-bit value;
   a digital-to analog converter (DAC) configured to convert the N-bit value to the second analog voltage signal V-DAC; and
   wherein the configurable ADC is configured to operate in any mode selected from modes including a single-slope mode, a successive approximation register (SAR) mode, and a sigma-delta modulation mode.

2. The configurable analog to digital converter (ADC) of claim 1, wherein the DAC is coupled to an N-bit memory for receiving an N-bit value stored in the N-bit memory and for converting the N-bit value to the second analog voltage signal V-DAC, the integrator includes an N-bit memory to store the N-bit value and an arithmetic logic unit (ALU) that is coupled to the N-bit memory, the N-bit memory and ALU configured to cooperate together to perform operations using both the N-bit value and C-OUT, and the N-bit memory is coupled to the DAC.

3. The configurable ADC of claim 2, further comprising: a single-slope logic module, a SAR logic module, and a sigma-delta modulation logic module that each include logic components, and the configurable ADC is configured for selection of one of the single-slope logic module, the SAR logic module, and the sigma-delta modulation logic module to control selection of a signal to be provided as the first analog voltage signal to the comparator and to control operation of the ALU and N-bit memory, wherein:

when the single-slope logic module is selected, the configurable ADC is configured to operate in the single-slope mode, when the SAR logic module is selected, the configurable ADC is configured to operate in the SAR mode, and when the sigma-delta modulation module is selected, the configurable ADC is configured to operate in the sigma-delta modulation mode.

4. The configurable ADC of claim 1, wherein the configurable ADC is further configured to permit selection of a first ADC mode for operation when receiving the first analog voltage signal from a first pixel of a first set of one or more pixels of a pixel array, and selection of a second ADC mode different than the first ADC mode for operation when receiving the first analog voltage signal from a second pixel of a second set of one or more pixels of the pixel array that is different than the first set.

5. The configurable ADC of claim 4, wherein respective selection of the first and second ADC modes is based upon a first sensed condition associated with the first set of one or more pixels and a second sensed condition that is different than the first sensed condition and is associated with the second set of one or more pixels.

6. The configurable ADC of claim 3, wherein the single-slope logic module is configured to control effective bypassing of the ALU when operating in the single-slope mode to cause C-OUT to be input to the N-bit memory without being processed by the ALU.

7. The configurable ADC of claim 2, wherein when operating in the single-slope mode, the DAC is caused to generate the V-DAC signal as a ramp that is synchronous with a clock signal.

8. The configurable ADC of claim 7, wherein when operating in the single-slope mode, the N-bit memory is configured to count clock pulses of the clock signal and to store the value of the count as the N-bit value, and when the comparator is triggered to change the value of C-OUT, the current N-bit value at the time that the comparator is triggered is effectively saved by being latched in the N-bit memory or readout from the N-bit memory.

9. The configurable ADC of claim 1, wherein when operating in the SAR mode, the DAC is caused to adjust the V-DAC in accordance with a binary search algorithm.

10. The configurable ADC of claim 2, wherein the N-bit value is a value D0-DN, and when operating in the SAR mode, the DAC and integrator are caused to:

a) adjust the V-DAC in accordance with a binary search algorithm;

b) shift a '1' into the N-bit memory into the MSB of the value D0-DN that has not yet been processed, the shifted '1' being a bit of interest;

c) read the value D0-DN;

d) apply a logical AND operation to C-OUT and the value D0-DN that was read;

e) write a result of the logical AND operation to the bit of interest of the value D0-DN; and f) iteratively perform the operations a)-e) until the last bit of the value D0-DN is processed, at which point the value D0-DN are ready for readout.

11. The configurable ADC of claim 10, wherein when operating in the sigma-delta modulation mode, the N-bit memory is configured to be read out throughout an entire integration interval.

12. The configurable ADC of claim 1, wherein when operating in the sigma-delta modulation mode, the configurable ADC is configured to track the slope of an integration node of a pixel coupled to the configurable ADC for providing the first analog voltage signal.

13. The configurable ADC of claim 1, wherein when operating in the sigma-delta modulation mode, the DAC is caused to output V-DAC to match a slope of integration of the first analog signal.

14. The configurable ADC of claim 2, wherein when operating in the sigma-delta modulation mode, the comparator is configured to be triggered to output C-OUT to have a particular value each time a predefined result of a comparison of a voltage from an integration node of a pixel coupled to the configurable ADC for providing the first analog voltage signal and the second analog signal V-DAC occurs, and C-OUT having the particular value determines whether the stored N-bit value is to be incremented and stored or remain the same.

15. The configurable ADC of claim 14, wherein when operating in the sigma-delta modulation mode, the integrator is configured to add a current N-bit value stored in the N-bit memory to C-OUT each time the comparator was triggered within a particular integration interval, the number of clock pulses between C-OUT pulses being indicative of a slope of the integration of the first analog signal, and a final N-bit value indicating the total number of C-OUT pulses within a particular integration interval, wherein the C-OUT pulses are occurrences of C-OUT having a value that causes the N-bit value to be incremented.

16. A readout circuit of an imaging device, the readout circuit comprising at least one configurable analog to digital converter (ADC), each configurable ADC comprising:

a comparator configured to receive and compare an analog voltage signal and a voltage V-DAC from a digital-to analog converter (DAC) and outputting a signal C-OUT that is responsive to a result of the comparison;

the DAC coupled to an N-bit memory for receiving an N-bit value stored in the N-bit memory; and an integrator, the integrator including the N-bit memory, which is coupled to an arithmetic logic unit (ALU), the N-bit memory and ALU configured to cooperate together to perform operations using both the N-bit value and C-OUT, wherein the DAC and the integrator are configurable to cause the configurable ADC to operate in any mode selected from modes including a single-slope mode, a successive approximation register (SAR) mode, and a sigma-delta modulation mode.

17. The readout circuit of claim 16, wherein the single-slope logic module is configured to control effective bypassing of the ALU when operating in the single-slope mode to cause C-OUT to be input to the N-bit memory without being processed by the ALU, the DAC is caused to generate the V-DAC signal as a ramp that is synchronous with a clock signal.

18. The readout circuit of claim 16, wherein when operating in the single-slope mode, the N-bit memory is configured to count clock pulses of the clock signal and stores the value of the count as the N-bit value, and when the comparator is triggered to change the value of C-OUT, the current N-bit value at the time that the comparator is triggered is effectively saved by being latched in the N-bit memory or readout from the N-bit memory.

19. The readout circuit of claim 16, wherein when operating in the sigma-delta modulation mode,
the N-bit memory is configured to be read out throughout an entire integration interval,
the configurable ADC is configured to track the slope of a voltage from an integration node of a pixel coupled to the configurable ADC for providing the first analog voltage signal,
the DAC is caused to output V-DAC to match a slope of integration of the first analog signal,
the comparator is configured to be triggered to output C-OUT to have a particular value each time a predefined result of a comparison of the voltage from the integration node and V-DAC signal occurs, and C-OUT having the particular value determines whether the stored N-bit value is to be incremented and stored or remain the same, and
the integrator is configured to add the current N-bit value stored in the N-bit memory to C-OUT each time the comparator was triggered within a particular integration interval, the number of clock pulses between C-OUT pulses a result being indicative of the slope of the integration of the first analog signal, and the final N-bit value indicating the total number of C-OUT pulses within a particular integration interval, wherein the C-OUT pulses are occurrences of the C-OUT having a value that causes the N-bit value to be incremented.

20. The readout circuit of claim 16, wherein a first configurable ADC of the at least one configurable ADC is configured to permit selection of a first ADC mode for operation when receiving the first analog voltage signal from a first pixel of a first set of one or more pixels of a pixel array, and
a second configurable ADC of the at least one configurable ADC is configured to permit selection of a second ADC mode different than the first ADC mode for operation when receiving the first analog voltage signal from a second pixel of a second set of one or more pixels of the pixel array that is different than the first set.

21. The readout circuit of claim 20, wherein respective selection of the first and second ADC modes is based upon a first sensed condition associated with the first set of one or more pixels and a second sensed condition that is different than the first sensed condition and is associated with the second set of one or more pixels.

22. A method comprising:
receiving and comparing an analog voltage signal and a voltage V-DAC from a digital-to analog converter (DAC) and outputting a signal C-OUT that is responsive to a result of the comparison;
receiving an N-bit value stored in an N-bit memory; and
cooperatively performing logic operations using both the N-bit value and the C-OUT signal output from the comparator,
wherein the DAC and management of C-OUT are configurable to cause the configurable ADC to operate in any mode selected from modes including a single-slope mode, a successive approximation register (SAR) mode, and a sigma-delta modulation mode.

23. The method of claim 22, wherein when operating in the single-slope mode the method further comprises:
counting clock pulses of the clock signal;
storing the value of the count as the N-bit value; and
when the value of C-OUT is changed, effectively saving the current N-bit value at the time that the value of C-OUT is changed by latching the N-bit value in the N-bit memory or reading out the N-bit value from the N-bit memory.

24. The method of claim 22, wherein when operating in the sigma-delta modulation mode, the method further comprises:
tracking a slope of an integration of the analog voltage signal; and
outputting V-DAC to match a slope of the integration.

* * * * *